US008354722B2

United States Patent
Campi, Jr. et al.

(10) Patent No.: US 8,354,722 B2
(45) Date of Patent: Jan. 15, 2013

(54) SCR/MOS CLAMP FOR ESD PROTECTION OF INTEGRATED CIRCUITS

(75) Inventors: John B. Campi, Jr., Westford, VT (US); Shunhua Chang, South Burlington, VT (US); Kiran V. Chatty, Oviedo, FL (US); Robert J. Gauthier, Jr., Hinesburg, VT (US); Junjun Li, Williston, VT (US); Rahul Mishra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/149,174

(22) Filed: May 31, 2011

(65) Prior Publication Data
US 2012/0305984 A1  Dec. 6, 2012

(51) Int. Cl.
  *H01L 29/78* (2006.01)
  *H01L 29/788* (2006.01)
  *H02H 9/00* (2006.01)
(52) U.S. Cl. ........ 257/355; 257/356; 257/357; 257/362; 257/371; 257/565; 257/E27.018; 257/E27.063; 257/E27.067; 257/E27.11; 257/E29.225; 361/56; 361/111; 361/118; 438/133; 438/135; 438/200
(58) Field of Classification Search .................. 257/355, 257/356, 357, 362, 371, 565, E27.018, E27.063, 257/E27.067, E27.11, E29.225; 361/56, 361/111, 118; 438/133, 135, 200
See application file for complete search history.

(56) References Cited

U.S. PATENT DOCUMENTS

| | | | |
|---|---|---|---|
| 3,947,727 A | 3/1976 | Stewart | |
| 5,400,202 A | 3/1995 | Metz et al. | |
| 5,781,388 A | 7/1998 | Quigley | |
| 6,268,992 B1 | 7/2001 | Lee et al. | |
| 6,337,501 B1 | 1/2002 | Fukuda et al. | |
| 6,756,642 B2 | 6/2004 | Lee et al. | |
| 7,193,251 B1 | 3/2007 | Vashchenko et al. | |
| 7,839,612 B1 | 11/2010 | Chan | |
| 7,855,862 B1 | 12/2010 | Gallagher et al. | |

(Continued)

OTHER PUBLICATIONS

M. Muhammad et al., "A Comprehensive ESD Protection Design Flow Utilizing Suite of ESD Verification Tools in Advanced Technologies," Design Automation Conference, DAC 2010, Jun. 17, 2010.

(Continued)

*Primary Examiner* — Dao H Nguyen
(74) *Attorney, Agent, or Firm* — Wood, Herron & Evans, LLP; Anthony J. Canale (57) ABSTRACT

An electrostatic discharge (ESD) protection circuit, methods of fabricating an ESD protection circuit, methods of providing ESD protection, and design structures for an ESD protection circuit. An NFET may be formed in a p-well and a PFET may be formed in an n-well. A butted p-n junction formed between the p-well and n-well results in an NPNP structure that forms an SCR integrated with the NFET and PFET. The NFET, PFET and SCR are configured to collectively protect a pad, such as a power pad, from ESD events. During normal operation, the NFET, PFET, and SCR are biased by an RC-trigger circuit so that the ESD protection circuit is in a high impedance state. During an ESD event while the chip is unpowered, the RC-trigger circuit outputs trigger signals that cause the SCR, NFET, and PFET to enter into conductive states and cooperatively to shunt ESD currents away from the protected pad.

23 Claims, 6 Drawing Sheets

U.S. PATENT DOCUMENTS

| | | | |
|---|---|---|---|
| 8,198,651 B2 * | 6/2012 | Langguth et al. | 257/170 |
| 2003/0007301 A1 * | 1/2003 | Ker et al. | 361/111 |
| 2005/0145947 A1 * | 7/2005 | Russ et al. | 257/356 |
| 2005/0270710 A1 * | 12/2005 | Ker et al. | 361/56 |
| 2009/0294855 A1 * | 12/2009 | Lim | 257/355 |
| 2010/0265622 A1 | 10/2010 | Campi, Jr. et al. | |

OTHER PUBLICATIONS

S.-H. Chen et al., "Optimization on MOS-Triggered SCR Structures for On-Chip ESD Protection," IEEE Transactions on Electron Devices, vol. 56, Issue:7, Jul. 2009, pp. 1466-1472.

* cited by examiner

SCR/MOS CLAMP FOR ESD PROTECTION OF INTEGRATED CIRCUITS

BACKGROUND

The present invention relates generally to semiconductor device fabrication and, more particularly, to electrostatic discharge (ESD) circuits for protecting a power pad or other low frequency input/output (I/O) pad, methods of fabricating an ESD protection circuit, methods for providing ESD protection, and design structures for an ESD protection circuit.

Modern electronics achieve high levels of functionality in small form factors by integrating multiple functions onto a single chip. A common fabrication process that allows high levels of integration at a relatively low cost is complementary metal-oxide-semiconductor (CMOS). CMOS processes build a combination of p-type and n-type metal-oxide-semiconductor field-effect transistors (MOSFETs) to implement logic gates and other types of digital circuits, as well as analog circuits.

Chips may be exposed to ESD events leading to potentially large and damaging currents within the integrated circuit. Increasing integration densities and performance demands on CMOS chips have resulted in reduced device dimensions, which has increased the susceptibility of integrated circuits to ESD events. Manufacturers, assemblers, and users of integrated circuits must take precautions to avoid unintentionally causing ESD events. For example, ESD prevention can be incorporated into the integrated circuit and may include special design techniques for I/O pins and pads, as well as supply pads, to prevent damage to the chip during handling between the time that the chip is manufactured until the time that the chip is installed on a circuit board and while the chip is installed on the circuit board. ESD protection circuits direct the current of an ESD event away from the internal circuits of the chip.

CMOS circuit applications require ESD protection circuits that have fast transient turn on times and that clamp the ESD pulse to a low enough voltage to prevent damage to the integrated circuit. ESD protection circuits must also be able to withstand sufficient ESD current levels so as to avoid being damaged by the ESD event, while preferably consuming minimal chip area.

Therefore, improved ESD protection circuits for CMOS circuit applications, methods for providing ESD protection, methods of fabricating an ESD protection circuit, and design structures for ESD protection circuits are needed for protecting integrated circuits against ESD events.

BRIEF SUMMARY

In one embodiment, a circuit is provided for protecting an integrated circuit from an electrostatic discharge (ESD) event. The circuit includes a first well of a first conductivity type and a second well of a second conductivity type forming a p-n junction with the first well. The circuit further includes a field-effect transistor with a drain in the first well, a source in the first well, and a gate, as well as a doped region of the first conductivity type in the second well. A first pad is electrically coupled to the doped region. A second pad is electrically coupled to the source of the field-effect transistor. A trigger circuit has a first output electrically coupled to the second well and a second output electrically coupled to the first well and to the gate of the field-effect transistor. The trigger circuit is configured to respond to the ESD event at the first pad by outputting a first trigger signal from the first output to the second well and outputting a second trigger signal from the second output to the first well and to the gate of the field-effect transistor. The first trigger signal and the second trigger signal cause the ESD event to be directed from the first pad through the doped region, the second well, the first well, and the source of the field-effect transistor to the second pad.

In another embodiment, a method is provided for fabricating an ESD protection circuit. The method includes forming a first well of a first conductivity type and a second well of a second conductivity type in a semiconductor substrate. The first and second wells define a p-n junction. The method further includes forming a field-effect transistor in the first well and forming a doped region of the first conductivity type in the second well. The method further includes electrically coupling a first pad to the doped region, electrically coupling a second pad to a source of the field-effect transistor, electrically coupling the second well to a first output of a trigger circuit, electrically coupling the first well to a second output of the trigger circuit, and electrically coupling a gate of the field-effect transistor to the second output of the trigger circuit.

In another embodiment, a method of protecting an integrated circuit from an ESD event is provided. The method includes providing a current path from a first pad to a second pad through a semiconductor controlled rectifier (SCR) that shares at least one doped region with a field-effect transistor. The method further includes driving the field-effect transistor into saturation to shunt a first portion of ESD current away from the first pad and triggering the SCR to shunt a second portion of ESD current away from the first pad in response to the ESD event at the first pad.

In an embodiment of the invention, a hardware description language (HDL) design structure is encoded on a machine-readable data storage medium. The HDL design structure comprises elements that, when processed in a computer-aided design system, generates a machine-executable representation of a circuit for protecting an integrated circuit during an electrostatic discharge (ESD) event. The HDL design structure includes a first well of a first conductivity type and a second well of a second conductivity type forming a p-n junction with the first well. The circuit further includes a field-effect transistor with a drain in the first well, a source in the first well, and a gate, as well as a doped region of the first conductivity type in the second well. A first pad is electrically coupled to the doped region. A second pad is electrically coupled to the source of the field-effect transistor. A trigger circuit has a first output electrically coupled to the second well and a second output electrically coupled to the first well and to the gate of the field-effect transistor. The trigger circuit is configured to respond to the ESD event at the first pad by outputting a first trigger signal from the first output to the second well and outputting a second trigger signal from the second output to the first well and to the gate of the field-effect transistor. The first trigger signal and the second trigger signal cause the ESD event to be directed from the first pad through the doped region, the second well, the first well, and the source of the first field-effect transistor to the second pad. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with the general description of the invention given above and the detailed description of the embodiments given below, serve to explain the embodiments of the invention.

DETAILED DESCRIPTION

Embodiments of the invention are generally directed to an electrostatic discharge (ESD) protection circuit for a power pad or a low frequency input/output (I/O) signal pad of an integrated circuit (i.e., semiconductor chip). The protection circuit includes a semiconductor controlled rectifier (SCR) and one or more metal-oxide-semiconductor field-effect transistors (MOSFET(s)) electrically coupled to the protected pad. The SCR and MOSFET(s) are configured to work cooperatively to shunt the ESD currents away from the protected pad to ground or other chip voltage rail during an ESD event. When the chip is powered, a resistor-capacitor (RC) trigger circuit maintains the SCR and the MOSFET(s) in high impendence states, so that voltages on the protected pad are relatively unaffected by the protection circuit. When the chip is unpowered, an ESD event may cause the RC-trigger circuit to trigger the SCR and switch on the MOSFET(s) so that the current associated with the ESD event is shunted away from the protected pad to a chip voltage supply rail. The ESD protection is provided with reduced transient response times and peak voltages with respect to an SCR protection circuit lacking a MOSFET, and with a higher current handling capability than a MOSFET protection circuit occupying the same chip area and lacking an SCR.

Figure 1A:
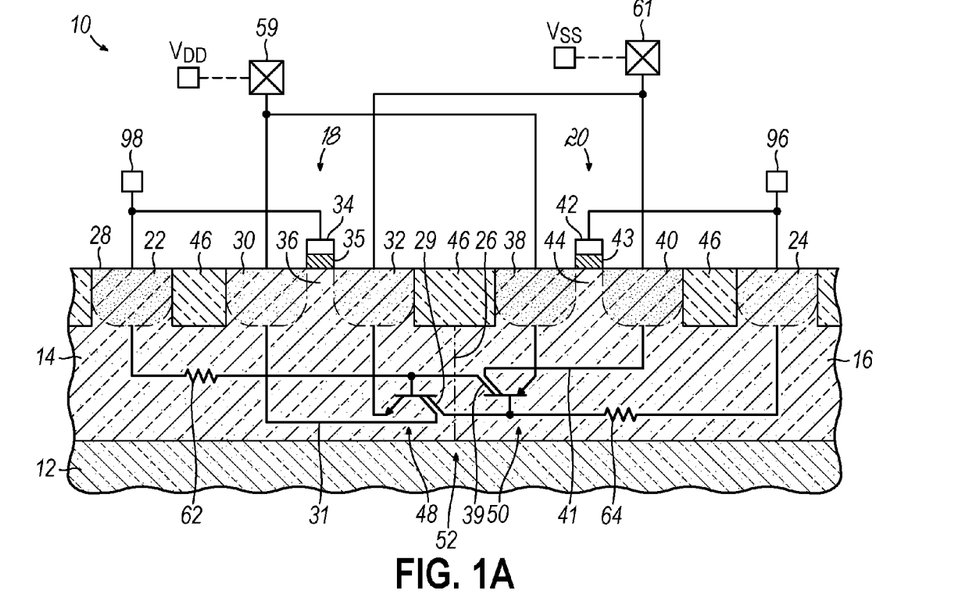
FIG. 1A is a diagrammatic cross-sectional view of a SCR/MOS device structure in accordance with an embodiment of the invention.
Figure 1B:
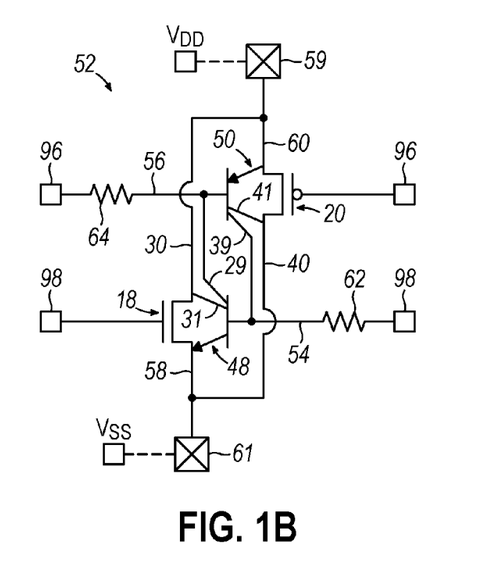
FIG. 1B is a schematic view of the electrical configuration of the SCR/MOS device structure in FIG. 1A in accordance with an embodiment of the invention.

With reference to FIGS. 1A and 1B in which like reference numerals refer to like features and in accordance with an embodiment of the invention, an ESD protection circuit 10 includes a p-well 14, an n-well 16, an n-channel field-effect transistor (NFET) 18, a p-channel field-effect transistor (PFET) 20, a p-well contact region 22, and an n-well contact region 24 formed in an active region of a substrate 12. The p-well 14 and the n-well 16 may be laterally adjacent and thereby share a vertical boundary, which forms a butted p-n junction 26. The contact regions 22, 24 may intersect a top surface 28 of the substrate 12 and have the same respective conductivity types as their respective wells 14, 16. Contact regions 22, 24 may thereby provide ohmic contacts to p-well 14 and n-well 16 respectively, and may contain higher dopant concentrations than their respective wells 14, 16. The substrate 12 may be a semiconductor-on-insulator (SOI) or bulk substrate comprised of lightly-doped p-type semiconductor material, such as p⁻ silicon, and is preferably monocrystalline or single-crystal material.

The NFET 18, which may be formed using p-well 14, includes a drain 30, a source 32, a gate 34, and a channel 36 between the drain 30 and the source 32. The gate 34 may be comprised of a conductive material, such as doped polycrystalline silicon or a metal, and is electrically isolated from the p-well 14 by a gate dielectric layer 35. The drain 30 and source 32 of NFET 18 may be formed in the p-well by n-type semiconductor regions laterally disposed on opposite sides of the gate 34. The drain 30 and source 32 are separated laterally by the channel 36, which is generally positioned in the p-well 14 below the gate 34 and is comprised of a region of the p-well 14. The channel 36 may couple the drain 30 and source 32 when a suitable control voltage is applied to the gate 34.

The PFET 20, which may be formed in n-well 16, includes a source 38, a drain 40, a gate 42, and a channel 44 between the source 38 and drain 40. The gate 42 may be comprised of a conductive material, such as doped polycrystalline silicon or a metal, and is electrically isolated from the n-well 16 by a gate dielectric layer 43. The source 38 and drain 40 of PFET 20 may be formed in the n-well 16 by p-type semiconductor regions laterally disposed on opposite sides of the gate 42. The source 38 and drain 40 are separated laterally by the channel 44, which is generally positioned in the n-well 16 below the gate 42 and is comprised of a region of the n-well 16. The channel 44 may couple the source 38 and drain 40 when a suitable control voltage is applied to the gate 42.

Dielectric regions 46 may be defined in the substrate 12 and are configured to laterally isolate the NFET 18, the PFET 20, and the contact regions 22, 24. The dielectric regions 46 may be formed by a shallow trench isolation (STI) technique that relies on a lithography and dry etching process to define closed-bottomed trenches in substrate 12, fills the trenches with dielectric material, and planarizes the layer to the top surface 28 of the substrate 12 using a chemical mechanical polishing (CMP) process. The dielectric material may be an oxide, such as densified tetraethylorthosilicate (TEOS) deposited by thermal chemical vapor deposition (THCVD) or a high-density plasma (HDP) oxide deposited with plasma assistance.

The source 32 of NFET 18, the p-well 14, the n-well 16, and the source 38 of PFET 20 may define a NPNP structure consisting of an NPN bipolar transistor 48 and a PNP bipolar transistor 50, which collectively define an SCR 52. The NPN bipolar transistor 48 may be structurally defined by three adjacent regions of the NPNP structure. A base region of NPN bipolar transistor 48 shares the p-well 14 with a first collector region 39 of PNP bipolar transistor 50, which forms a p-trigger gate 54 of SCR 52. A first collector region 29 of NPN bipolar transistor 48 shares the n-well 16 with a base region of PNP bipolar transistor 50, which forms an n-trigger gate 56 of SCR 52. A second collector region 31 of NPN bipolar transistor 48 may be formed by the first n-type region forming the drain 30 of NFET 18, so that the first n-type region is shared by the drain 30 of NFET 18 and the second collector region 31 of NPN bipolar transistor 48. The emitter region of NPN bipolar transistor 48 shares the second n-type region forming the source 32 of NFET 18, forming a cathode 58 of SCR 52. The PNP transistor 50 may be structurally defined by three adjacent regions of the NPNP structure. An emitter region of the PNP bipolar transistor 50 may share the first p-type region forming the source 38 of PFET 20, so that the first p-type region forms an anode 60 of SCR 52. PNP bipolar transistor 50 may also have a second collector region 41 sharing the second p-type region defined by drain 40 of PFET 20.

The ESD protection circuit 10 may connect a first pad 59, which may be a positive voltage supply pad, to a second pad 61, which may be a negative voltage supply pad. To this end, the source 38 of PFET 20 and the drain 30 of NFET 18 may be electrically coupled to the first pad 59, and the source 32 of NFET 18 and the drain 40 of PFET 20 may be electrically coupled to the second pad 61. In this way, the ESD protection circuit 10 may provide an ESD path between pads 59, 61 through the NFET 18, the PFET 20, and the transistors 48 and 50 forming the SCR 52.

Contact regions 22, 24 may provide electrical contacts with the p-well 14 and n-well 16 forming p-trigger and n-trigger gates 54, 56 respectively. Contact region 22 may be formed of a more highly doped semiconductor having the same conductivity type as the p-well 14. Contact region 24 may be formed of a more highly doped semiconductor having the same conductivity type as the n-well 16. Resistor 62 may thereby be formed by the resistance to electrical current provided by the p-well 14 between the p-well contact region 22 and the body of the p-well 14, which may be analogous to the base resistance of NPN bipolar transistor 48. Likewise, resistor 64 may be formed by the resistance to the flow of electrical current provided by the n-well 16 between the n-well contact region 24 and the body of the n-well 16, which may be analogous to the base resistance of PNP bipolar transistor 50.

The NFET 18, PFET 20, contact regions 22, 24, and SCR 52 may be fabricated as part of a CMOS or BiCMOS chip. As understood by a person having ordinary skill in the art of semiconductor fabrication, standard CMOS or BiCMOS fabrication processes may be employed using a suitable substrate 12, such as a bulk semiconductor substrate or a device layer of an SOI substrate. For example, the p-well 14, n-well 16, and contact regions 22, 24 may be formed by masking, implanting dopants of suitable impurity species with suitable kinetic energies, and thermally activating the implanted dopants. NFET 18 and PFET 20 may be formed in p-well 14 and n-well 16 respectively by depositing a layer stack that includes one or more insulator layers and one or more conductive layers. Photolithography and RIE may then be used to define the gates 34, 42 from the layer stack. The drain 30 and source 32 for NFET 18 may be formed by implanting a dopant such as P, As, Sb, or other suitable n-type dopant, while the source 38 and drain 40 for PFET 20 may be implanted with a dopant such as B, Al, Ga, or any other suitable p-type dopant. The dopants may be introduced by ion implantation using the respective gates 34, 42 as a self-aligning mask and separate resist masks during n-type and p-type dopant implantations and activated by an annealing step.

Standard back-end-of-line (BEOL) processing may follow the formation of the ESD protection circuit 10 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level, high density framework of conductive interconnections is formed. Damascene processes and materials used in damascene processes are understood by a person having ordinary skill in the art.

The BEOL interconnect structure may include one or more lower dielectric layers containing metallization that supplies local interconnect wiring, and one or more upper dielectric layers containing metallization for levels of interconnect wiring. The metallization may define a wiring path electrically coupling the first pad 59 with the local interconnect wiring of the source 38 of PFET 20 and the drain 30 of NFET 18. The metallization may define a wiring path coupling the second pad 61 with the local interconnect wiring for the source 32 of NFET 18 and the drain 40 of PFET 20.

The first and second pads 59, 61 may be fabricated using BEOL processes, such as layer deposition, photolithography and subtractive etching understood by a person having ordinary skill in the art. For example, pads 59, 61 may be fabricated by depositing a layer stack including a top layer of aluminum (Al), copper (Cu), or an alloy (e.g., AlCu) onto the topmost level of the interconnect wiring and shaping the layer stack with one or more photolithography and etching processes.

Figure 2:
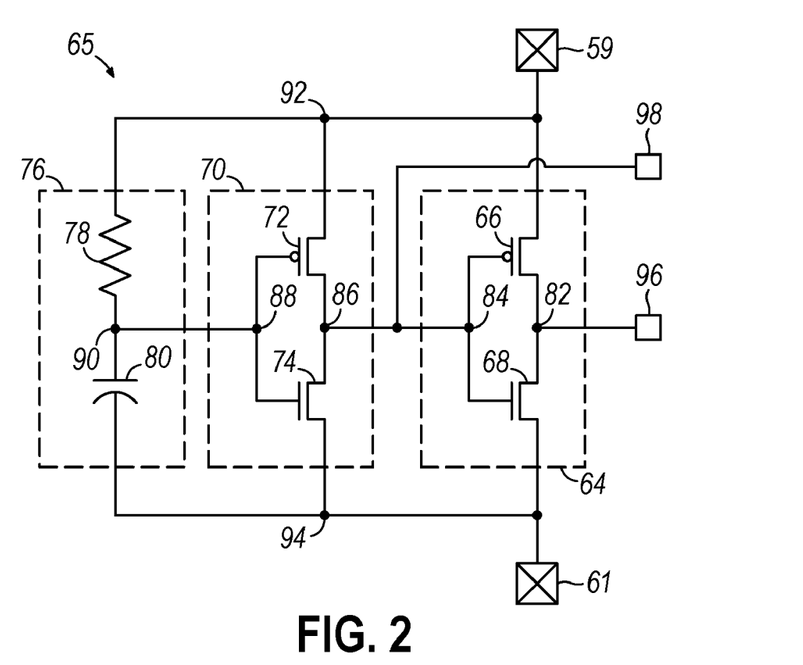
FIG. 2 is a schematic view illustrating a resistor-capacitor (RC) trigger circuit which supplies trigger signals to the device structure in FIGS. 1A and 1B.

Referring now to FIG. 2, a resistor-capacitor (RC) trigger circuit 65 includes a positive supply node 92, a negative supply node 94, first and second inverters 64, 70, and a resistor-capacitor (RC) circuit 76. The first inverter 64 includes a PFET 66 and an NFET 68, and the second inverter 70 includes a PFET 72 and an NFET 74. The drain of the NFET 68 may be electrically coupled to the drain of PFET 66, which forms a first output 82 of RC trigger circuit 65. The gate of PFET 66 may be electrically coupled to the gate of NFET 68 to form an input 84 of inverter 64. The second inverter 70 may be formed in a similar fashion by electrically coupling the drains of PFET 72 and NFET 74 to form a second output 86 of RC trigger circuit 65, and electrically coupling the gates of PFET 72 and NFET 74 to form an input 88 of the second inverter 70. The inverters 64, 70 may be connected by electrically coupling the second output 86 of trigger circuit 65 to the input 84 of inverter 64. The sources of PFETs 66, 72 may be electrically coupled to the positive supply node 92, which may be electrically coupled to the first pad 59. The sources of NFETs 68, 74 may be electrically coupled to a negative supply node 94, which may be electrically coupled to the second pad 61.

RC circuit 76 may include a resistor 78 and a capacitor 80 connected in series, which forms a common node 90 that is electrically coupled to the input 88 of the second inverter 70. Resistor 78 may electrically couple the RC node 90 to the positive supply node 92, and the capacitor 80 may electrically couple the RC node 90 to the negative supply node 94. As a result, the voltage at the RC node 90 may have a delayed response to changes in voltage between the positive supply node 92 and negative supply node 94.

The RC-trigger circuit 65 may provide a first trigger signal 96 at the first output 82 of the RC trigger circuit 65, and a second trigger signal 98 at the second output 88 of the RC trigger circuit 65. The trigger signals 96, 98 may be electrically coupled to the ESD protection circuit 10 so that the ESD protection circuit 10 presents a high impedance between the pads 59, 61 when the chip is connected to power and a low impedance between the pads 59, 61 during an ESD event. For example, in one embodiment as illustrated in FIGS. 1A and 1B, the first output 82 of trigger circuit 65 may be electrically coupled to the gate 42 of PFET 20 and the n-well contact region 24, so that the trigger signal 96 is provided to the PFET 20 and through the resistor 64 to the n-trigger gate 56 of SCR

52. Likewise, the second output 86 of trigger circuit 65 may be electrically coupled to the gate 34 of NFET 18 and to the p-well contact region 22, so that the trigger signal 98 is provided to the NFET 18 and through the resistor 62 to the p-trigger gate 54 of SCR 52.

In operation, the first pad 59 may be electrically coupled to a positive chip supply voltage, such as $V_{DD}$, and second pad 61 may be electrically coupled to a negative chip supply voltage, such as ground or $V_{SS}$. Shortly after power is applied to the chip, the capacitor 80 may become sufficiently charged through resistor 78 so that RC node 90 is at voltage approximately equal to $V_{DD}$. This may result in the input 88 of the second inverter 70 being at approximately the same voltage level as the source of PFET 72, so that the gate-to-source voltage ($V_{GS}$) of PFET 72 is approximately zero. $V_{GS}$ may thereby be less than the threshold voltage ($V_{TH}$) of PFET 72, so that PFET 72 is in a high impedance state commonly referred to as a cutoff condition. Thus, little or no current may flow between the source and drain of the PFET 72.

In contrast, the $V_{GS}$ of NFET 74 may be a positive voltage approximately equal to the difference between $V_{DD}$ and $V_{SS}$, which may be above the $V_{TH}$ of NFET 74. The NFET 74 may thereby be in a low impedance state commonly referred to as a saturation condition, which may electrically couple the second output 86 of trigger circuit 65 to the negative supply node 94. The second output 86 of the trigger circuit 65 may thereby be pulled by the NFET 74 to the voltage of the negative supply node 94, so that the trigger signal 98 has a voltage approximately equal to $V_{SS}$.

The voltage level on the second output 86 of trigger circuit 65 may result in PFET 66 having a negative $V_{GS}$ equal to approximately the difference between $V_{SS}$ and $V_{DD}$, so that PFET 66 is saturated, and NFET 68 having a $V_{GS}$ equal to approximately zero volts, so that NFET 68 is cut off. The first output 82 of trigger circuit may therefore be electrically coupled to the positive supply node 92 so that the trigger signal 96 is at or near $V_{DD}$. Thus, under normal operating conditions, the voltage of trigger signal 96 will be approximately equal to the voltage of the positive supply voltage connected to pad 59, and the voltage of trigger signal 98 will be approximately equal to the voltage of the negative supply voltage connected to second pad 61.

The trigger signal 96 may thereby bias the n-trigger gate 56 of SCR 52 and the gate 42 of PFET 20 to approximately the same voltage as pad 59. The base-emitter junction of PNP bipolar transistor 50 may therefore have little or no forward bias, which places the PNP bipolar transistor 50 in a non-conductive state. Likewise, the $V_{GS}$ of PFET 20 may also be approximately zero, which causes the PFET 20 to be in a cutoff condition. The trigger signal 98 may bias the p-trigger gate 54 of SCR 52 and the gate 34 of NFET 18 to approximately the same voltage as second pad 61. The base-emitter junction of NPN bipolar transistor 48 may therefore have little or no forward bias, which places the NPN bipolar transistor 48 in a non-conductive state. Likewise, trigger signal 98 may result in the $V_{GS}$ of NFET 18 being approximately zero, causing the NFET 18 to be cut off. With the MOSFETs 18, 20 and the transistors 48, 50 switched off, the ESD protection circuit 10 may be maintained in a high impedance state so that little or no current is conducted between the pads 59, 61 though either the SCR 52 or the MOSFETs 18, 20. The RC-trigger circuit 65 thus maintains the ESD protection circuit 10 in the high impedance state when the chip is powered.

In an unpowered state, such as when the chip is not installed on a circuit board or when the chip is installed in a circuit board that is not powered, the voltages on pads 59, 61 may be nominally zero, since any voltages previously applied to the chip tend to bleed off over time. The capacitor 80 may therefore be fully discharged, so that the input 88 of the second inverter 70 is at zero volts relative to the supply nodes 92, 94. During a positive voltage ESD event, the voltage on pad 59 may rise significantly relative to second pad 61, which may increase the voltage at the positive supply node 92 relative to the negative supply node 94.

Because the response of the RC node 90 to changes in voltage on the positive supply node 92 may be delayed by an RC time constant formed between resistor 78 and capacitor 80, the voltage at the RC node 90 may remain near zero relative to the negative supply node 94 during the ESD event. The input 88 of the second inverter 70 may therefore initially be at low voltage level relative to the positive supply node 92. This may result in PFET 72 having a negative $V_{GS}$, so that the PFET 72 becomes saturated. PFET 72 may thereby electrically couple the positive supply node 92 to the second output 86 of RC trigger circuit 65. The voltage at RC node 90 may also result in the $V_{GS}$ of NFET 74 being approximately zero, so that NFET 74 remains in a cutoff condition. The second output 86 of trigger circuit 65 may thereby have a positive voltage approximately equal to the voltage at positive supply node 92 so that trigger signal 98 is at a voltage approximately equal to that present on pad 59. The second output 86 of trigger circuit 65 may also result in a positive voltage at the input 84 of inverter 64. The $V_{GS}$ of NFET 68 may thereby have a positive voltage, and the $V_{GS}$ of PFET 66 may be approximately zero, so that NFET 68 is saturated and PFET 66 is cut off. The first output 82 of trigger circuit 65 may thereby be at or near zero volts relative to negative supply node 94 so that trigger signal 96 is at a voltage approximately equal to that present on second pad 61.

Trigger signal 98 may cause current to flow into the p-trigger gate 54 of SCR 52 through resistor 62, which may forward bias the base-emitter junction of NPN bipolar transistor 48 so that NPN bipolar transistor 48 enters a conductive state. Similarly, the trigger signal 96 may draw current out of the n-trigger gate 56 of SCR 52 through resistor 64, thus working cooperatively with NPN bipolar transistor 48 to pull the base-emitter junction of PNP bipolar transistor 50 low relative to the voltage of pad 59 so that PNP bipolar transistor 50 enters a conductive state. The SCR 52 may thereby be triggered into a low-impedance state so that the anode 60 of SCR 52 shunts ESD current away from first pad 59 through the SCR 52 and out the cathode 58 of SCR 52 to second pad 61. Additional electrical coupling of the pads 59, 61 may be provided through the transistors 48, 50 by the second collector regions 31, 41 of transistors 48, 50 respectively. Once triggered, the SCR 52 may remain in the low impedance state until the shunted ESD current drops below a threshold known as the holding current. The SCR 52 may thereby remain in a low impedance state until the ESD pulse has dissipated.

The same trigger signals 96, 98 that trigger the SCR 52 into a latch-up condition during the ESD event may also provide a positive $V_{GS}$ to NFET 18 and a negative $V_{GS}$ to PFET 20. The NFET 18 and the PFET 20 may thereby be driven into saturation so that, in addition to the electrical coupling provided by the SCR 52, pads 59, 61 may be further electrically coupled through the NFET 18 and the PFET 20. The trigger signals 96, 98 generated by RC-trigger circuit 65 in response to the ESD event may thereby result in the ESD protection circuit 10 entering a low impedance state, thereby electrically coupling the first and second pads 59, 61 for the duration of the ESD event.

The ability of an ESD protection circuit to effectively protect a chip from ESD conditions depends on both the current handling ability and the switching speed of the circuit.

Because SCRs provide relatively large cross sectional areas of semiconductor through which ESD currents may flow as compared to similarly sized MOSFETs, SCRs typically provide higher ESD current handling ability than MOS clamp circuits for a given substrate surface area. However, the length of time required for an SCR to change from a non-conducting state to a conducting state, or the turn-on time of the SCR, is typically longer than that of a MOS clamp circuit. This longer turn-on time may be due to the longer intrinsic turn on time of the bi-polar transistors comprising the SCR as compared to a high speed MOSFET, and by the time required for minority carriers to build up in the base regions of the bi-polar transistors. In particular, SCR-based ESD protection circuits may have difficulty turning on fast enough to provide effective protection against the charge device model (CDM) ESD test, which typically produces ESD pulses having a width of 1-2 nanoseconds with rise times of about 200 picoseconds. In contrast, MOS clamp circuits typically respond more quickly to ESD events than SCRs due to the higher switching speed of the MOSFET devices. But because MOSFET devices have conduction channels with small vertical dimensions, the gate widths required to handle peak ESD currents without damage may be in the range of 4000 µm. MOS clamp circuits are thus typically much less area efficient than SCR circuits for a given current handling ability. However, by integrating MOSFETs 18, 20 with SCR 52 to form the composite ESD protection circuit 10, area efficiency and response time may be balanced to provide improved response time with respect to a pure SCR circuit and better current handling ability than a MOS clamp lacking an SCR.

Figure 3:
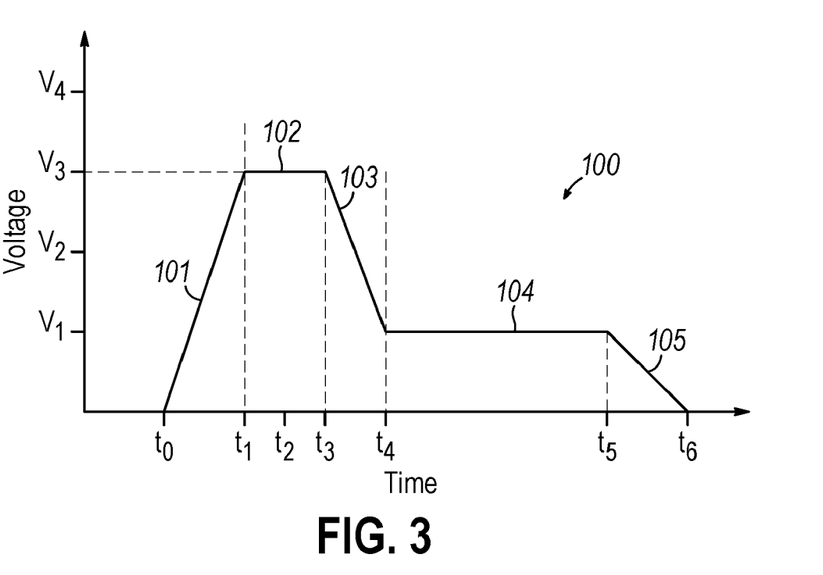
FIG. 3 is a graph illustrating an exemplary voltage verses time curve for an ESD protection circuit employing a composite SCR/MOS clamp.

Referring now to FIG. 3, a graphical diagram showing an exemplary curve 100 of device voltage as a function of time is presented to illustrate the relative contributions of the MOSFETs 18, 20 and the SCR 52 to the composite response of the ESD protection circuit 10 during an ESD event at the first pad 59. The times ($t_x$) and voltages ($V_x$) in FIG. 3 are intended to provide relative reference points for discussion purposes, but the graph is exemplary only and is not intended to provide accurate absolute time or voltage scales. Time $t_0$ may represent the onset of an ESD event, at which point the voltage on pad 59 begins to ramp upward from zero volts in response to the occurrence of the ESD event. Between time $t_0$ and $t_1$, the voltage on pad 59 may increase at a rapid rate with advancing time as represented by curve segment 101, and may begin to exceed the normal operating voltages received on pad 59. At time $t_1$, the voltage on pad 59 may reach a sufficient level to cause the RC-trigger circuit 65 to generate trigger signals 96, 98 of sufficient voltage levels to trigger SCR 52 and to drive both the NFET 18 and the PFET 20 into saturation. For the sake of simplicity in describing the timing of events here, it may be assumed that the voltage levels necessary to saturate the NFET 18, the PFET 20, and to trigger the SCR 52 are the same. However, embodiments of the invention are not so limited, and it should be understood that the NFET 18, the PFET 20, and the SCR 52 may each be switched on or triggered at different voltage levels.

Because the NFET 18 and the PFET 20 may be high speed devices, the NFET 18 and the PFET 20 may respond almost immediately to the trigger signals 96, 98 and the ESD voltage may be clamped at $V_3$ beginning at time $t_1$. The NFET 18 and PFET 20 may provide relatively constant on-resistances once driven into saturation by the trigger signals 96, 98, so that the voltage on pad 59 may be limited to a relatively constant level by the MOSFETs 18, from time $t_1$ to $t_3$, as represented by curve segment 102. In contrast to the fast response of the MOSFETs 18, 20, the SCR 52 may have a delayed response to trigger signals 96, 98. Thus, an ESD protection circuit 10 lacking the MOSFETs 18, 20 would allow the voltage on pad 59 to continue to ramp upward after time $t_1$, reaching $V_4$ at time $t_2$. At time $t_2$, sufficient minority carriers may have been injected into the base regions of transistors 48, 50 so that the SCR 52 begins to conduct significant current away from the first pad 59. From time $t_2$ to $t_4$ (sometimes referred to as the SCR current rise time), the current passing through the SCR 52 may rise as the conduction spreads over the full cross-sectional area of SCR 52. The clamping action of the MOSFETs 18, 20 may maintain the voltage on pad 59 at $V_3$ over the duration of curve segment 102, which prevents the ESD voltage from continuing to increase while the SCR 52 becomes sufficiently conductive to protect pad 59.

The conductivity of SCR 52 may increase sufficiently to begin contributing significantly to the total current being shunted away from pad 59 by the ESD protection circuit 10 at about time $t_3$. This increase in the total shunted current may cause the voltage on pad 59 to begin dropping at time $t_3$ and to continue to drop as time advances toward time $t_4$, as represented by curve segment 103. As conduction through the SCR 52 continues to increase, the ESD voltage on pad 59 may continue to drop until time $t_4$, at which point the SCR 52 has become fully conductive. Because both the MOSFETs 18, 20 and the SCR 52 are working cooperatively to shunt current away from pad 59, the total impedance between the pads 59, 61 may be less than would be provided by an ESD protection circuit relying on either the MOSFETs 18, 20 or the SCR 52 alone. The ESD protection circuit 10 may thereby provide a lower ESD voltage $V_1$ from time $t_4$ to $t_5$ as compared to protection circuits lacking either the SCR 52 or the MOSFETs 18, 20.

The SCR 52 and MOSFETs 18, 20 may continue to conduct a relatively constant amount of current from time $t_4$ to $t_5$, so that the voltage on pad 59 is maintained at $V_1$ as represented by curve segment 104. At time $t_5$, the ESD pulse begins to dissipate, so that the voltage at pad 59 begins to drop as represented by curve segment 105. By time $t_6$, the ESD pulse has dissipated, which marks the end of the event. Shortly before time $t_6$ is reached, the voltage levels of the trigger signals 96, 98 may become insufficient to maintain the NFET 18 and PFET 20 in the saturation condition, so that the NFET 18 and PFET 20 return to the cut off condition. Similarly, the SCR 52 may return to the high impedance state when the current passing through the SCR 52 drops below the holding current, which may occur at or slightly before time $t_6$. The ESD protection circuit 10 may thereby return to the high impedance state after the ESD event is over. The ESD protection circuit 10 recovers from the ESD event and remains functional to await the occurrence of another future ESD event.

The MOSFETs 18, 20 thus provide a quick response to the ESD event, which may prevent the ESD voltage from continuing to rise after the ESD protection circuit has been triggered. The MOSFETs 18, 20 may limit the peak voltages on pad 59, providing time for the SCR to become conductive. The SCR 52 will typically have a higher current capacity than the MOSFETs 18, 20, so that the ESD voltage on pad 59 may be further lowered by the SCR 52 as the SCR 52 becomes conductive. ESD protection circuit 10 may thereby provide improved response times and reduced peak voltage levels as compared to ESD circuits lacking a MOS clamp. ESD protection circuit 10 may also provide a lower average voltage and higher current shunting capacity than ESD circuits lacking an SCR. By allowing designers to control peak and average voltages independently, ESD protection circuit 10 may result in higher area efficiency by allowing the use of smaller MOS clamp devices for a given current handling and average voltage requirement as compared to ESD circuits lacking SCR 52. For example, the addition of SCR 52 may allow the gate width of NFET 18 and PFET 20 to be reduced from 4000 μm to 3000 μm while still meeting ESD testing requirements, which saves significant substrate area and thereby reduces chip costs.

While described in connection with the protection of power pads, the embodiments of the invention may be alternatively used to protect low speed or low frequency input/output (I/O) pads used to transfer data or signals to and from the integrated circuit on a chip.

Figure 4A:
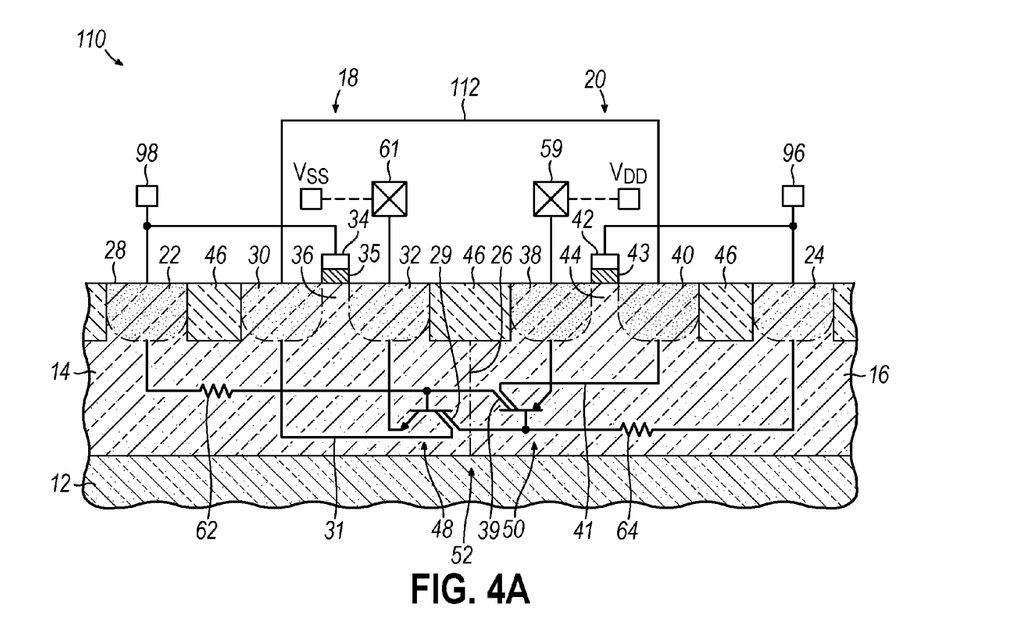
FIG. 4A is a diagrammatic cross-sectional view of a SCR/MOS device structure in accordance with an alternative embodiment of the invention.
Figure 4B:
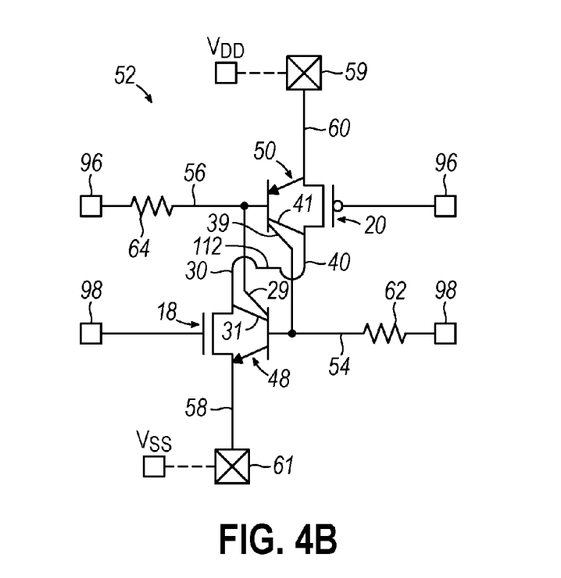
FIG. 4B is a schematic view illustrating the electrical configuration of the SCR/MOS device structure in FIG. 4A in accordance with an alternative embodiment of the invention.

With reference to FIGS. 4A and 4B in which like reference numerals refer to like features in FIGS. 1A and 1B and in accordance with an alternative embodiment of the invention, an ESD protection circuit 110 includes NFET 18, PFET 20 and SCR 52. The components of ESD protection circuit 110 similar to the protection circuit 10 illustrated in FIGS. 1A and 1B. However, the drain 30 of NFET 18 and the drain 40 of PFET 20 are electrically coupled together to form a middle node 112 instead of being electrically coupled directly to pads 59 and 61, respectively. The NFET 18 and the PFET 20 thus form a single stacked MOSFET clamp, so that ESD currents shunted away from pad 59 by the PFET 20 also pass through the NFET 18 to reach second pad 61. In all other aspects, the structure and operation of ESD protection circuit 110 is essentially the same as previously described with respect to ESD protection circuit 10. The stacked arrangement of the MOSFETs 18, 20 in circuit 110 may reduce the voltage across the NFET 18 and the PFET 20 during normal operation of the chip when pad 59 is electrically coupled to a positive voltage supply, such as $V_{DD}$, and second pad 61 is electrically coupled to a negative voltage supply, such as $V_{SS}$ or ground. The reduced voltage drops across the individual MOSFETs 18, 20 may result in lower gate-to-drain and source-to-drain voltages, which may increase the power supply voltage at which gate insulator breakdown occurs, and may also reduce the DC leakage current of the MOS clamp. However, the stacked arrangement may also increase the MOSFET clamping resistance during an ESD event as compared to the parallel arrangement in ESD protection circuit 10.

Figure 5A:
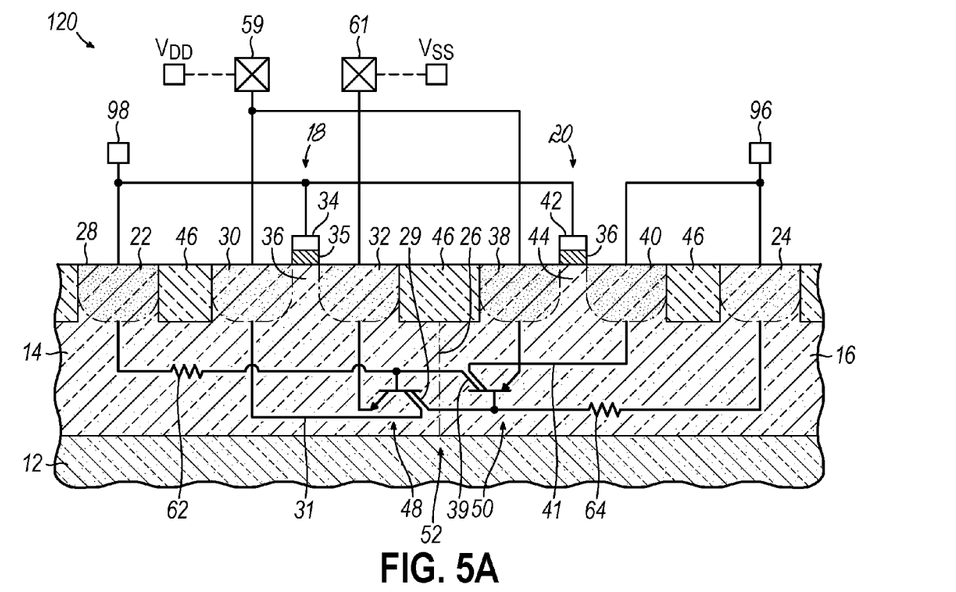
FIG. 5A is a diagrammatic cross-sectional view of a SCR/MOS device structure in accordance with an alternative embodiment of the invention.
Figure 5B:
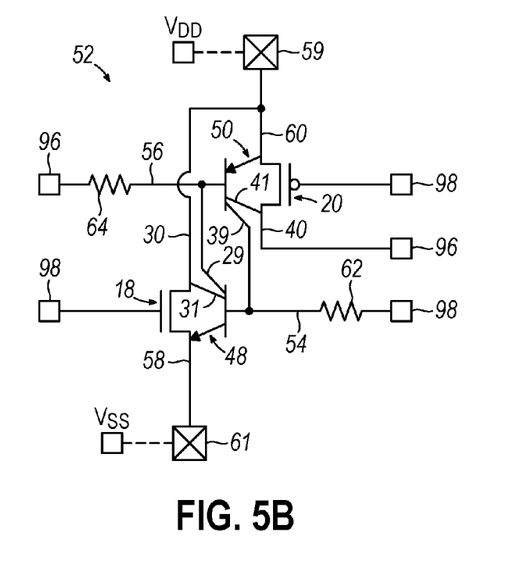
FIG. 5B is a schematic view illustrating the electrical configuration of the SCR/MOS device structure in FIG. 5A in accordance with an alternative embodiment of the invention.

With reference to FIGS. 5A and 5B in which like reference numerals refer to like features in FIGS. 1A and 1B and in accordance with an alternative embodiment of the invention, an ESD protection circuit 120 includes NFET 18, PFET 20 and SCR 52. The components of ESD protection circuit 120 are similar to the protection circuit 10 illustrated in FIGS. 1A and 1B. However, the drain 40 of PFET 20 is electrically coupled to trigger signal 96 (i.e., the first output 82 of RC trigger circuit 65) instead of second pad 61, and the gate 42 of PFET 20 is electrically coupled to trigger signal 98 (i.e., the second output 86 of RC trigger circuit 65) instead of trigger signal 96. PFET 20 may thereby replace the PFET 66 in the first inverter 64 (FIG. 2), reducing the total semiconductor area required by RC-trigger circuit 65.

In operation, pad 59 may be electrically coupled to a positive chip supply voltage, such as $V_{DD}$, and second pad 61 may be electrically coupled to a negative chip supply voltage, such as ground or $V_{SS}$. As previously described with respect to FIGS. 1A and 1B, shortly after power is applied to the chip, the voltage of trigger signal 96 may be approximately equal to that of the positive supply voltage connected to pad 59, and the voltage of trigger signal 98 may be approximately equal to that of the negative supply voltage connected to second pad 61. The trigger signals 96, 98 may thereby bias the p-trigger and n-trigger gates 54, 56 of SCR 52 so that the SCR 52 is in a high impedance state, and provide a $V_{GS}$ to NFET 18 so that the NFET 18 is in a cutoff condition. The ESD protection circuit 120 may thereby be maintained in a high impedance state so that little or no current is conducted between the pads 59, 61 though either the SCR 52 or the NFET 18. The RC-trigger circuit 65 (which now includes PFET 20 in place of PFET 66) thus maintains the ESD protection circuit 120 in the high impedance state when the chip is powered.

The operation of ESD protection circuit 120 when in an unpowered state is substantially similar to that previously described with respect to the ESD protection circuit 10 except that the MOS clamp function is provided solely by NFET 18, and the first inverter 64 operates with PFET 20 instead of PFET 66 (FIG. 2). A positive ESD event may therefore result in trigger signal 96 having a voltage lower than the voltage on pad 59, forward biasing the base-emitter junction of PNP bipolar transistor 50. The ESD event may also result in trigger signal 98 having a voltage higher than the voltage on second pad 61, forward biasing the base-emitter junction of NPN bipolar transistor 48. SCR 52 may thereby be triggered into a low impedance state by the ESD event in essentially the same manner as described with respect to ESD protection circuit 10. The trigger signal 98 may also provide a positive $V_{GS}$ to NFET 18 causing NFET 18 enter a saturation condition, which may provide an additional current path between pads 59 and 61.

Figure 6A:
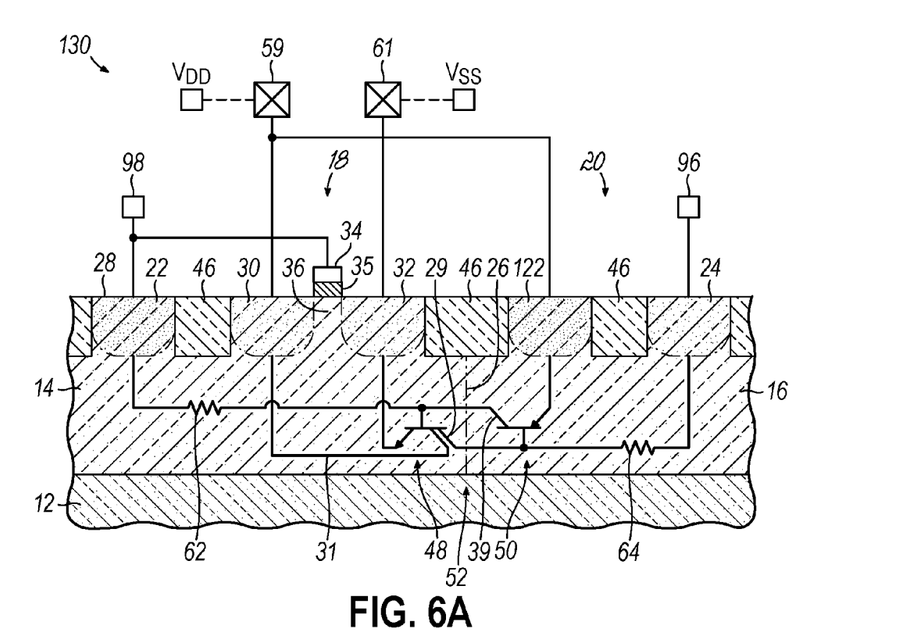
FIG. 6A is a diagrammatic cross-sectional view of a SCR/MOS device structure in accordance with an alternative embodiment of the invention.
Figure 6B:
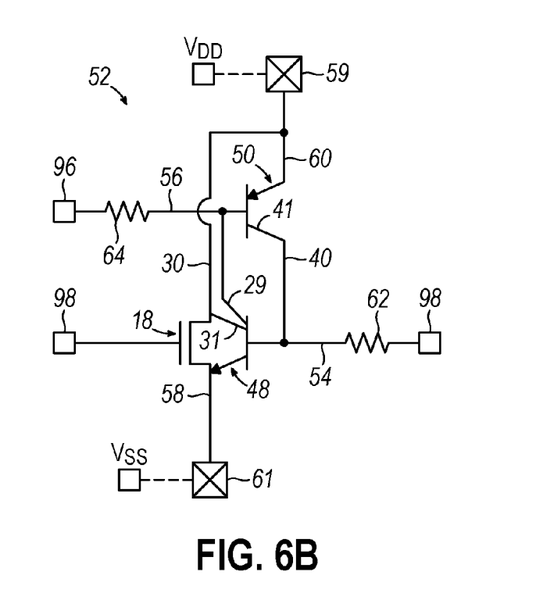
FIG. 6B is a schematic view illustrating the electrical configuration of the SCR/MOS device structure in FIG. 6A in accordance with an alternative embodiment of the invention.

With reference to FIGS. 6A and 6B in which like reference numerals refer to like features in FIGS. 1A and 1B and in accordance with an alternative embodiment of the invention, an ESD protection circuit 130 includes NFET 18 and SCR 52. The ESD protection circuit 130 is similar to ESD protection circuit 10 except that the PFET 20 is omitted. P-type region 122 may form the anode 60 of SCR 52, and may be substantially similar to the p-type region that forms the source 38 of PFET 20 (FIG. 1A). The n-well contact region 24 and the adjacent dielectric region 46 may be located laterally so that they are adjacent to p-type region 122, which may reduce the total surface area of ESD protection circuit 130 as compared to protection circuit 10. P-well contact region 22 and the gate 34 of NFET 18 may be electrically coupled to trigger signal 98, the drain 30 of NFET 18 and the anode 60 of SCR 52 may be electrically coupled to pad 59, and the second n-type region shared by the source 32 of NFET 18 and the cathode 58 of SCR 52 may be electrically coupled to second pad 61.

In operation, pad 59 may be electrically coupled to a positive chip supply voltage, such as $V_{DD}$, and second pad 61 may be electrically coupled to a negative chip supply voltage, such as ground or $V_{SS}$. As previously described with respect to FIGS. 1A and 1B, shortly after power is applied to the chip, the voltage of trigger signal 96 may be approximately equal to that of the positive supply voltage connected to pad 59, and the voltage of trigger signal 98 may be approximately equal to that of the negative supply voltage connected to second pad 61. The trigger signals 96, 98 may thereby bias the p-trigger and n-trigger gates 54, 56 of SCR 52 so that the SCR 52 is in a high impedance state, with trigger signal 98 providing a $V_{GS}$ to NFET 18 so that the NFET 18 is in a cutoff condition. The ESD protection circuit 130 may thereby be maintained in a high impedance state so that little or no current is conducted between the pads 59, 61 though either the SCR 52 or the NFET 18. The RC-trigger circuit 65 thus maintains the ESD protection circuit 130 in the high impedance state when the chip is powered.

The operation of ESD protection circuit 130 when in an unpowered state is also similar to that previously described with respect to the ESD protection circuit 120, but without the PFET 20. A positive ESD event may result in the voltage of trigger signal 96 being lower than the voltage on pad 59, which may forward bias the base-emitter junction of PNP bipolar transistor 50. The ESD event may also result in the voltage of trigger signal 98 being higher than the voltage on second pad 61, which may forward bias the base-emitter junction of NPN bipolar transistor 48. SCR 52 may thereby be triggered into a low impedance state by the ESD event in essentially the same manner as with ESD protection circuit 10. The voltage of trigger signal 98 may also provide a positive $V_{Gs}$ to NFET 18 so that the NFET 18 becomes saturated, which may provide an additional ESD current path between pads 59 and 61.

Figure 7:
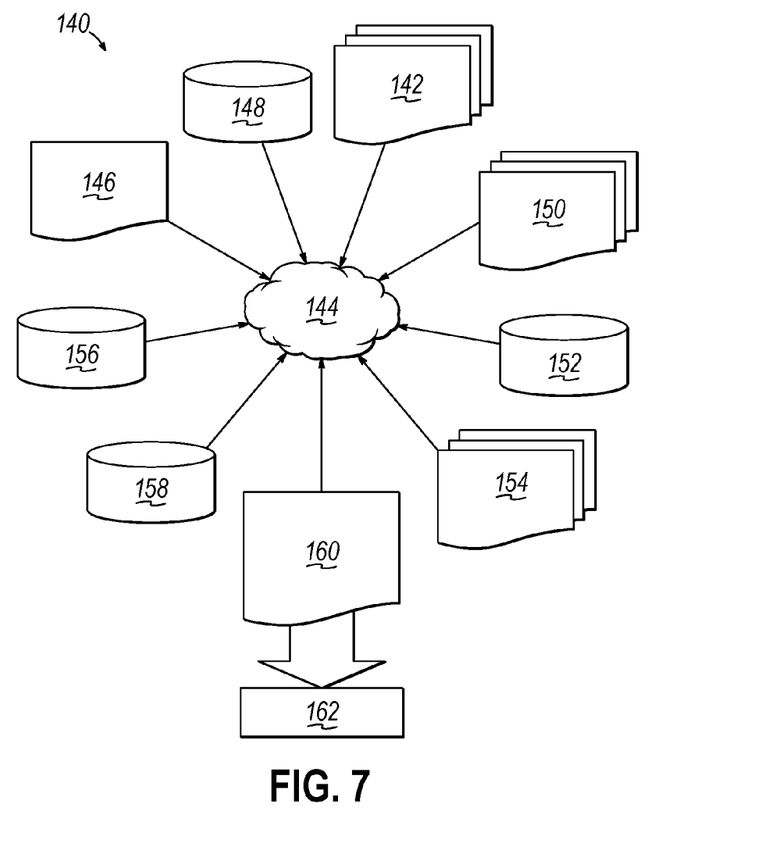
FIG. 7 is a flow diagram of a design process used in semiconductor design, manufacture, and/or test.

FIG. 7 shows a block diagram of an exemplary design flow 140 used for example, in semiconductor IC logic design, simulation, test, layout, and manufacture. Design flow 140 includes processes, machines and/or mechanisms for processing design structures or devices to generate logically or otherwise functionally equivalent representations of the design structures and/or devices described above and shown in FIGS. 1A, 1B, 2, 4A, 4B, 5A, 5B, 6A and 6B. The design structures processed and/or generated by design flow 140 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g., a machine for programming a programmable gate array).

Design flow 140 may vary depending on the type of representation being designed. For example, a design flow 140 for building an application specific IC (ASIC) may differ from a design flow 140 for designing a standard component or from a design flow 140 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 142 that is preferably processed by a design process 144. Design structure 142 may be a logical simulation design structure generated and processed by design process 144 to produce a logically equivalent functional representation of a hardware device. Design structure 142 may also or alternatively comprise data and/or program instructions that when processed by design process 144, generate a functional representation of the physical structure of a hardware device. Whether representing functional and/or structural design features, design structure 142 may be generated using electronic computer-aided design (ECAD) such as implemented by a core developer/designer. When encoded on a machine-readable data transmission, gate array, or storage medium, design structure 142 may be accessed and processed by one or more hardware and/or software modules within design process 144 to simulate or otherwise functionally represent an electronic component, circuit, electronic or logic module, apparatus, device, or system such as those shown in FIGS. 1A, 1B, 2, 4A, 4B, 5A, 5B, 6A and 6B. As such, design structure 142 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 144 preferably employs and incorporates hardware and/or software modules for synthesizing, translating, or otherwise processing a design/simulation functional equivalent of the components, circuits, devices, or logic structures shown in FIGS. 1A, 1B, 2, 4A, 4B, 5A, 5B, 6A and 6B to generate a netlist 146 which may contain design structures such as design structure 142. Netlist 146 may comprise, for example, compiled or otherwise processed data structures representing a list of wires, discrete components, logic gates, control circuits, I/O devices, models, etc. that describes the connections to other elements and circuits in an integrated circuit design. Netlist 146 may be synthesized using an iterative process in which netlist 146 is resynthesized one or more times depending on design specifications and parameters for the device. As with other design structure types described herein, netlist 146 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 144 may include hardware and software modules for processing a variety of input data structure types including netlist 146. Such data structure types may reside, for example, within library elements 148 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 150, characterization data 152, verification data 154, design rules 156, and test data files 158 which may include input test patterns, output test results, and other testing information. Design process 144 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 144 without deviating from the scope and spirit of the invention. Design process 144 may also include modules for performing standard circuit design processes such as timing analysis, verification, design rule checking, place and route operations, etc.

Design process 144 employs and incorporates logic and physical design tools such as HDL compilers and simulation model build tools to process design structure 142 together with some or all of the depicted supporting data structures along with any additional mechanical design or data (if applicable), to generate a second design structure 160. Design structure 160 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 142, design structure 160 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A, 1B, 2, 4A, 4B, 5A, 5B, 6A and 6B. In one embodiment, design structure 160 may comprise a compiled, executable HDL simulation model that functionally simulates the devices shown in FIGS. 1A, 1B, 2, 4A, 4B, 5A, 5B, 6A and 6B.

Design structure 160 may also employ a data format used for the exchange of layout data of integrated circuits and/or symbolic data format (e.g. information stored in a GDSII (GDS2), GL1, OASIS, map files, or any other suitable format for storing such design data structures). Design structure 160 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A, 1B, 2, 4A, 4B, 5A, 5B, 6A and 6B. Design structure 160 may then proceed to a stage 162 where, for example, design structure 160: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A circuit for protecting an integrated circuit from an electrostatic discharge (ESD) event, the circuit comprising:
   a first well of a first conductivity type;
   a second well of a second conductivity type, the second well defining a p-n junction with the first well;
   a first field-effect transistor including a drain in the first well, a source in the first well, and a gate;
   a doped region of the first conductivity type in the second well;
   a first pad electrically coupled to the doped region;
   a second pad electrically coupled to the source of the first field-effect transistor; and
   a trigger circuit having a first output electrically coupled to the second well and a second output electrically coupled to the first well and to the gate of the first field-effect transistor, the trigger circuit configured to respond to the ESD event at the first pad by outputting a first trigger signal from the first output to the second well and outputting a second trigger signal from the second output to the first well and to the gate of the first field-effect transistor,
   wherein the first trigger signal and the second trigger signal cause the ESD event to be directed from the first pad through the doped region, the second well, the first well, and the source of the first field-effect transistor to the second pad.

2. The circuit of claim 1 wherein the first well is a p-well, the second well is an n-well, the doped region is a p-type doped region, and the first field-effect transistor is an n-channel field-effect transistor (NFET).

3. The circuit of claim 1 wherein the source of the first field-effect transistor, the first well, the second well, and the doped region define a semiconductor controlled rectifier (SCR) having the source of the first field-effect transistor as a cathode and the doped region as an anode.

4. The circuit of claim 1 wherein the first pad is a first power supply pad and the second pad is a second power supply pad.

5. The circuit of claim 1 further comprising:
   a second field-effect transistor having a source comprised of the doped region in the second well, a drain in the second well, and a gate.

6. The circuit of claim 5 wherein the doped region is a p-type doped region, the second field-effect transistor is a p-channel field-effect transistor (PFET), the first well is a p-well, the second well is an n-well, and the first field-effect transistor is an n-channel field-effect transistor (NFET).

7. The circuit of claim 5 wherein the first pad is further electrically coupled to the drain of the first field-effect transistor, the second pad is further electrically coupled to the drain of the second field-effect transistor, and the trigger circuit is further configured to output the first trigger signal from the first output to the gate of the second field-effect transistor.

8. The circuit of claim 5 wherein the trigger circuit is further electrically coupled with the gate of the second field-effect transistor, the drain of the first field-effect transistor is further electrically coupled to the drain of the second field-effect transistor, and the trigger circuit is further configured to output the first trigger signal from the first output to the gate of the second field-effect transistor.

9. The circuit of claim 1 wherein the trigger circuit is further electrically coupled with the gate of the second field-effect transistor, the first pad is further electrically coupled to the drain of the first field-effect transistor, and the trigger circuit is further configured to output the first trigger signal from the first output to the drain of the second field-effect transistor and to output the second trigger signal from the second output to the gate of the second field-effect transistor.

10. The circuit of claim 1 wherein the first pad is further electrically coupled to the drain of the first field-effect transistor.

11. A method of fabricating an ESD protection circuit, the method comprising:
forming a first well of a first conductivity type in a semiconductor substrate;
forming a second well of a second conductivity type in the semiconductor substrate so that the second well defines a p-n junction with the first well;
forming a first field-effect transistor in the first well;
forming a doped region of the first conductivity type in the second well;
electrically coupling a first pad to the doped region;
electrically coupling a second pad to a source of the first field-effect transistor;
electrically coupling the second well to a first output of a trigger circuit;
electrically coupling the first well to a second output of the trigger circuit and
electrically coupling a gate of the first field-effect transistor to the second output of the trigger circuit.

12. The method of claim 11 wherein the first well is a p-well, the second well is an n-well, the doped region is a p-type doped region, and the first field-effect transistor is an n-channel field-effect transistor (NFET).

13. The method of claim 11 wherein the doped region is a source of a second field-effect transistor formed in the second well, and further comprising:
electrically coupling the first pad to a drain of the first field-effect transistor;
electrically coupling the second pad to a drain of the second field-effect transistor; and
electrically coupling the first output of the trigger circuit to a gate of the second field-effect transistor.

14. The method of claim 11 wherein the doped region is a source of a second field-effect transistor formed in the second well, and further comprising:
electrically coupling a drain of the second field-effect transistor to a drain of the first field-effect transistor; and
electrically coupling the first output of the trigger circuit to a gate of the second field-effect transistor.

15. The method of claim 11 wherein the doped region is a source of a second field-effect transistor formed in the second well, and further comprising:
electrically coupling the first pad to a drain of the first field-effect transistor;
electrically coupling the first output of the trigger circuit to a drain of the second field-effect transistor; and
electrically coupling the second output of the trigger circuit to a gate of the second field-effect transistor.

16. The method of claim 11 further comprising:
electrically coupling the first pad to a drain of the first field-effect transistor.

17. A method of protecting an integrated circuit from an electrostatic discharge (ESD) event at a first pad by providing a current path from the first pad to a second pad through a semiconductor controlled rectifier (SCR) that shares at least one doped region with a first field-effect transistor, the method comprising:
in response to the ESD event at the first pad, driving the first field-effect transistor into saturation to shunt a first portion of ESD current away from the first pad; and
in further response to the ESD event at the pad, triggering the SCR to shunt a second portion of ESD current away from the first pad.

18. The method of claim 17 further comprising:
in further response to the ESD event at the pad, driving a second field-effect transistor into saturation to cooperate with the first field-effect transistor to shunt the second portion of the ESD current away from the pad.

19. The method of claim 18 wherein the first field-effect transistor is an n-channel field-effect transistor (NFET) in a p-well, the second field-effect transistor is a p-channel field-effect transistor (PFET) in an n-well, and the SCR is formed by a drain of the NFET, the p-well, the n-well, and a drain of the PFET.

20. A hardware description language (HDL) design structure encoded on a machine-readable data storage medium, the HDL design structure comprising elements that when processed in a computer-aided design system generates a machine-executable representation of a circuit for protecting an integrated circuit during an electrostatic discharge (ESD) event, the HDL design structure comprising:
a first well of a first conductivity type;
a second well of a second conductivity type, the second well defining a p-n junction with the first well;
a first field-effect transistor including a drain in the first well, a source in the first well, and a gate;
a doped region of the first conductivity type in the second well;
a first pad electrically coupled to the doped region;
a second pad electrically coupled to the source of the first field-effect transistor; and
a trigger circuit having a first output electrically coupled to the second well and a second output electrically coupled to the first well and to the gate of the first field-effect transistor, the trigger circuit configured to respond to the ESD event at the first pad by outputting a first trigger signal from the first output to the second well and outputting a second trigger signal from the second output to the first well and to the gate of the first field-effect transistor,
wherein the first trigger signal and the second trigger signal cause the ESD event to be directed from the first pad through the doped region, the second well, the first well, and the source of the first field-effect transistor to the second pad.

21. The HDL design structure of claim 20 wherein the HDL design structure comprises a netlist.

22. The HDL design structure of claim 20 wherein the DHL design structure resides on storage medium as a data format used for the exchange of layout data of integrated circuits.

23. The HDL design structure of claim 20 wherein the HDL design structure resides in a programmable gate array.

* * * * *